US008062936B2

(12) United States Patent
Seo et al.

(10) Patent No.: US 8,062,936 B2
(45) Date of Patent: Nov. 22, 2011

(54) METHOD OF FABRICATING ARRAY SUBSTRATE

(75) Inventors: Hyun-Sik Seo, Anyang-si (KR); Jong-Uk Bae, Seoul (KR); Dae-Hwan Kim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 225 days.

(21) Appl. No.: 12/654,585

(22) Filed: Dec. 23, 2009

(65) Prior Publication Data

US 2010/0210056 A1 Aug. 19, 2010

(30) Foreign Application Priority Data

Feb. 19, 2009 (KR) ........................ 10-2009-0013980

(51) Int. Cl.
*H01L 21/00* (2006.01)
(52) U.S. Cl. ................................ 438/149; 257/E21.372
(58) Field of Classification Search .................. 438/149, 438/745, 751; 257/291, 292, E21.372, E21.411, 257/E21.412
See application file for complete search history.

(56) References Cited

U.S. PATENT DOCUMENTS 7,666,697 B2 * 2/2010 Yoon ............................... 438/48

\* cited by examiner

*Primary Examiner* — Quoc Hoang
(74) *Attorney, Agent, or Firm* — McKenna Long & Aldridge, LLP

(57) ABSTRACT

A method of fabricating an array substrate for a display device includes steps of forming a gate line and a gate electrode on a substrate, forming a gate insulating layer and an intrinsic amorphous silicon layer, forming an oxide semiconductor layer, increasing a conductive property of the oxide semiconductor layer, forming a metal layer, forming a first photoresist pattern and a second photoresist pattern having a thinner thickness than the first photoresist pattern, forming a data line, a source drain pattern, an oxide semiconductor pattern and an active layer, removing the second photoresist pattern and exposing the source drain pattern, wet-etching the source drain pattern using a first etchant, thereby forming source and drain electrodes, wet-etching the oxide semiconductor pattern using a second etchant, thereby forming ohmic contact layers, removing the first photoresist pattern, forming a passivation layer having a drain contact hole exposing the drain electrode on the source and drain electrodes, and forming a pixel electrode connected to the drain electrode through the drain contact hole, wherein the active layer has a uniform thickness in the switching region.

13 Claims, 8 Drawing Sheets

METHOD OF FABRICATING ARRAY SUBSTRATE

This application claims the benefit of Korean Patent Application No. 10-2009-0013980, filed on Feb. 19, 2009, which is hereby incorporated by reference in its entirety.

BACKGROUND OF THE INVENTION

1. Field of the Invention

The present invention relates to an array substrate, and more particularly, to a method of fabricating an array substrate for a display device including a thin film transistor.

2. Discussion of the Related Art

With rapid development of information technologies, display devices for displaying a large amount of information have been promptly developed. More particularly, flat panel display (FPD) devices having a thin profile, light weight and low power consumption such as organic electroluminescent display (OLED) devices and liquid crystal display (LCD) devices have been actively pursued and replaced with cathode ray tube (CRT).

Among the liquid crystal display devices, active matrix type liquid crystal display devices, which include thin film transistors to control on/off of respective pixels, have been widely used because of their high resolution, color rendering capability and superiority in displaying moving images.

In addition, organic electroluminescent display devices have been recently spotlighted because they have many merits as follows: organic electroluminescent display devices have high brightness and low driving voltages; because they are self-luminous, the organic electroluminescent display devices have excellent contrast ratios and ultra thin thicknesses; the organic electroluminescent display devices have response time of several micro seconds, and there are advantages in displaying moving images; the organic electroluminescent display devices have wide viewing angles and are stable under low temperatures; since the organic electroluminescent display devices are driven by low voltage of direct current (DC) 5V to 15V, it is easy to design and manufacture driving circuits; and a manufacturing process of an organic electroluminescent display device is very simple because only deposition and encapsulation steps are required. In the organic electroluminescent display devices, active matrix type display devices also have been widely used because of their low power consumption, high definition and large-sized possibility.

The active matrix type liquid crystal display devices and the active matrix type organic electroluminescent display devices include an array substrate having thin film transistors as switching elements to control on/off of respective pixels.

FIG. 1 is a cross-sectional view of illustrating an array substrate for a liquid crystal display device or an organic electroluminescent display device according to the related art. FIG. 1 shows a pixel region including a thin film transistor.

In FIG. 1, a gate line (not shown) and a data line 33 are formed on a substrate 11 and cross each other to define a pixel region P. A gate electrode 15 is formed in a switching region TrA of the pixel region P. A gate insulating layer 18 is formed on the gate electrode 15, and a semiconductor layer 28, which includes an active layer 22 of intrinsic amorphous silicon and ohmic contact layers 26 of impurity-doped amorphous silicon, is formed on the gate insulating layer 18. Source and drain electrodes 36 and 38 are formed on the ohmic contact layers 26. The source and drain electrodes 36 and 38 are spaced apart from each other to correspond to the gate electrode 15. The gate electrode 15, the gate insulating layer 18, the semiconductor layer 28 and the source and drain electrodes 36 and 38 sequentially formed in the switching region TrA constitute a thin film transistor Tr.

A passivation layer 42 is formed on the source and drain electrodes 36 and 38 and the exposed active layer 22. The passivation layer 42 has a drain contact hole 35 exposing the drain electrode 38. A pixel electrode 50 is formed on the passivation layer 42 in the pixel region P. The pixel electrode 50 contacts the drain electrode 38 through the drain contact hole 45. Here, a semiconductor pattern 29 is formed under the data line 33. The semiconductor pattern 29 has a double-layered structure including a first pattern 27 of the same material as the ohmic contact layers and a second pattern 23 of the same material as the active layer 22.

In the semiconductor layer 28 formed in the switching region TrA of the array substrate, the active layer 22 of intrinsic amorphous silicon has different thicknesses depending on the position. That is, a portion of the active layer 22 under the ohmic contact layers 26 has a first thickness t1, and a portion of the active layer 22 exposed by removing the ohmic contact layers 26 has a second thickness t2, which is thinner than the first thickness t1. The different thicknesses of the active layer 22 are caused by a manufacturing method, and this decreases characteristics of the thin film transistor Tr.

FIGS. 2A to 2E are cross-sectional views of illustrating an array substrate in processes of fabricating the same according to the related art. FIGS. 2A to 2E show the related art substrate in steps of forming a semiconductor layer and source and drain electrodes.

Although not shown in the figures, a gate line and a gate electrode are formed on a substrate 11 by depositing a metallic material and patterning it. The gate line extends along a first direction, and the gate electrode is connected to the gate line. A gate insulating layer is formed on the gate line and the gate electrode by depositing an inorganic insulating material.

Next, in FIG. 2A, an intrinsic amorphous silicon layer 20, an impurity-doped amorphous silicon layer 24 and a metal layer 30 are sequentially formed on the gate insulating layer. A photoresist layer (not shown) is formed on the metal layer 30 by applying photoresist. The photoresist layer is exposed to light through a mask and developed to form a first photoresist pattern 91 and a second photoresist pattern 92. The first photoresist pattern 91 corresponds to a region where the source and drain electrodes are formed and has a third thickness. The second photoresist pattern 92 corresponds to a region between the source and drain electrodes and has a fourth thickness, which is thinner than the third thickness.

In FIG. 2B, a source drain pattern 31, an impurity-doped amorphous silicon pattern 25 and an active layer 22 are formed by removing the metal layer 30 of FIG. 2A, which is exposed by the first and second photoresist patterns 91 and 92, and the impurity-doped amorphous silicon layer 24 of FIG. 2A and the intrinsic amorphous silicon layer 20 of FIG. 2A, which are disposed under the metal layer 30 of FIG. 2A.

In FIG. 2C, the second photoresist pattern 92 of FIG. 2B having the fourth thickness is removed by an ashing process. At this time, the first photoresist pattern 91 of FIG. 2B having the third thickness is partially removed to form a third photoresist pattern 93 having a reduced thickness on the source drain pattern 31.

In FIG. 2D, source and drain electrodes 36 and 38 are formed by removing the source drain pattern 31 of FIG. 2C exposed by the third photoresist pattern 93. The source and drain electrodes 36 and 38 are spaced apart from each other. At this time, the impurity-doped amorphous silicon pattern 25 is exposed between the source and drain electrodes 35 and 38.

In FIG. 2E, the impurity-doped amorphous silicon pattern 25 of FIG. 2D exposed between the source and drain electrodes 36 and 38 is dry-etched and removed, thereby forming ohmic contact layers 26 under the source and drain electrodes 36 and 38, respectively.

At this time, the impurity-doped amorphous silicon pattern 25 of FIG. 2D is over-etched. That is, dry-etching is performed for an enough time to completely remove the impurity-doped amorphous silicon pattern 25 of FIG. 2D between the source and drain electrodes 36 and 38, and the active layer 22 under the impurity-doped amorphous silicon pattern 25 of FIG. 2D is also partially removed by a predetermined thickness. Accordingly, the active layer 22 has different thicknesses t1 and t2 in a region under the ohmic contact layers 26 and a region between the source and drain electrodes 36 and 38. If the dry-etching is not performed for the enough time, the impurity-doped amorphous silicon pattern 25 of FIG. 2D remains on the active layer 22 between the source and drain electrodes 36 and 38. To prevent this, the dry-etching is performed for the enough time, and the active layer 22 between the source and drain electrodes 36 and 38 is partially removed.

Therefore, in the related art array substrate, the active layer 22 has different thicknesses, and this lowers the characteristics of the thin film transistor Tr of FIG. 1.

Meanwhile, the intrinsic amorphous silicon layer 20 of FIG. 2A may be deposited to have a thickness within a range of 1500 Å to 1800 Å considering the thickness of the active layer 22 removed during the dry-etching. Accordingly, the deposition time is increased, and the productivity is lowered.

SUMMARY OF THE INVENTION

Accordingly, the present invention is directed to a method of fabricating an array substrate for a display device that substantially obviate one or more of the problems due to limitations and disadvantages of the related art.

An object of the present invention is to provide a method of fabricating an array substrate for a display device that prevents damage of an active layer and improves properties of a thin film transistor.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an array substrate for a display device includes steps of forming a gate line and a gate electrode on a substrate, where a pixel region including switching region is defined, forming a gate insulating layer and an intrinsic amorphous silicon layer on the gate line and a gate electrode, forming an oxide semiconductor layer on the intrinsic amorphous silicon layer, increasing a conductive property of the oxide semiconductor layer such that the oxide semiconductor layer has an ohmic property, forming a metal layer on the oxide semiconductor layer having the ohmic property, forming first and second photoresist patterns on the metal layer, the first photoresist pattern having a first thickness, the second photoresist pattern having a second thickness thinner than the first thickness, forming a data line, a source drain pattern, an oxide semiconductor pattern and an active layer by patterning the metal layer, the oxide semiconductor layer and the intrinsic amorphous silicon layer using the first and second photoresist patterns as an etching mask, wherein the active layer is disposed over the gate electrode in the switching region, the oxide semiconductor pattern is disposed on the active layer, the data line crosses the gate line to define the pixel region, and the source drain pattern is connected to the data line and disposed on the oxide semiconductor pattern, removing the second photoresist pattern and exposing the source drain pattern, wet-etching the source drain pattern exposed by removing the second photoresist pattern using a first etchant, thereby forming source and drain electrodes and exposing the oxide semiconductor pattern, wet-etching the oxide semiconductor pattern exposed by wet-etching the source and drain pattern using a second etchant, thereby forming ohmic contact layers and exposing the active layer, removing the first photoresist pattern and exposing the source and drain electrodes, forming a passivation layer on the source and drain electrodes exposed by removing the first photoresist pattern and the active layer exposed by wet-etching the oxide semiconductor pattern, the passivation layer having a drain contact hole exposing the drain electrode, and forming a pixel electrode on the passivation layer in the pixel region, the pixel electrode connected to the drain electrode through the drain contact hole, wherein the active layer has a uniform thickness in the switching region.

In another aspect, a method of fabricating an array substrate for a display device includes steps of forming a gate line and a gate electrode on a substrate, where a pixel region including switching region is defined, forming a gate insulating layer and an intrinsic amorphous silicon layer on the gate line and a gate electrode, forming an oxide semiconductor layer on the intrinsic amorphous silicon layer, forming an oxide semiconductor pattern and an active layer in the switching region by patterning the oxide semiconductor layer and the intrinsic amorphous silicon layer, increasing a conductive property of the oxide semiconductor pattern such that the oxide semiconductor pattern has an ohmic property, forming a metal layer on the oxide semiconductor pattern having the ohmic property, wet-etching the metal layer using a first etchant, thereby forming a data line, a source electrode and a drain electrode and exposing the oxide semiconductor pattern, wherein the data line crosses the gate line to define the pixel region, the source electrode is connected to the data line, and the drain electrode is space apart from the source electrode on the oxide semiconductor pattern, wet-etching the oxide semiconductor pattern exposed by wet-etching the metal layer using a second etchant, thereby forming ohmic contact layers and exposing the active layer, forming a passivation layer on the source and drain electrodes and the active layer exposed by wet-etching the oxide semiconductor pattern, the passivation layer having a drain contact hole exposing the drain electrode, and forming a pixel electrode on the passivation layer in the pixel region, the pixel electrode connected to the drain electrode through the drain contact hole, wherein the active layer has a uniform thickness in the switching region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

FIGS. 3A to 3K are cross-sectional views of illustrating an array substrate in processes of fabricating the same according to an embodiment of the present invention. FIGS. 3A to 3K show a pixel region including a thin film transistor. For convenience of explanation, a region for the thin film transistor is defined as a switching region TrA.

Figure 1:
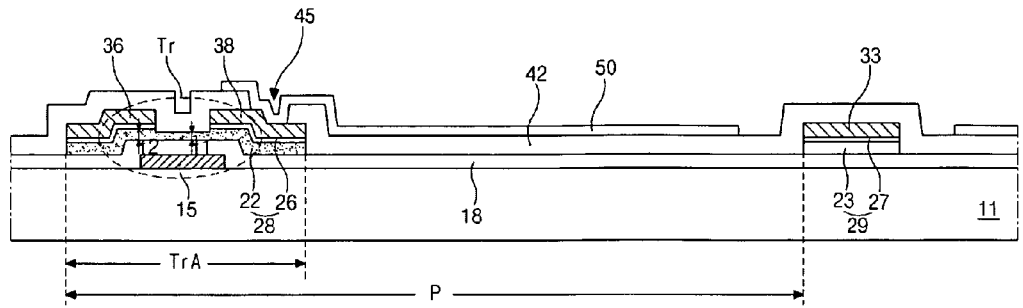
FIG. 1 is a cross-sectional view of illustrating an array substrate for a liquid crystal display device or an organic electroluminescent display device according to the related art.
Figure 2A:
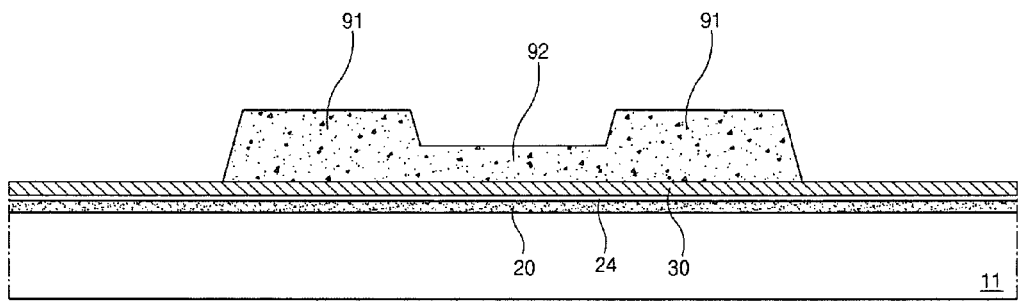
FIGS. 2A to 2E are cross-sectional views of illustrating an array substrate in processes of fabricating the same according to the related art.
Figure 2B:
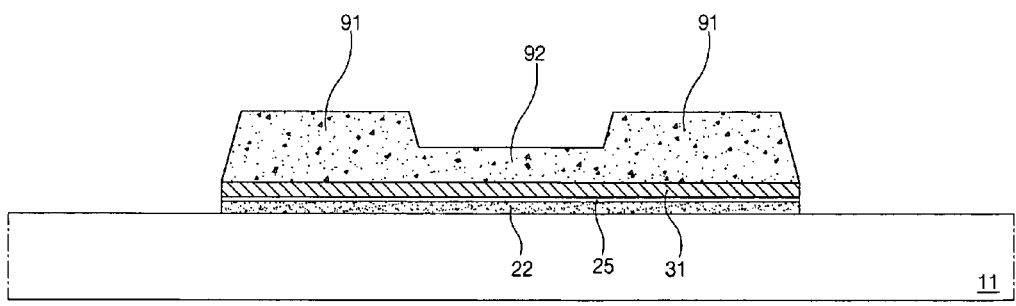
Figure 2C:
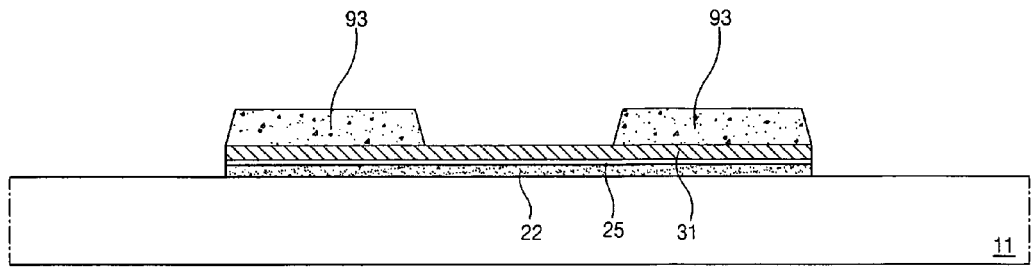
Figure 2D:
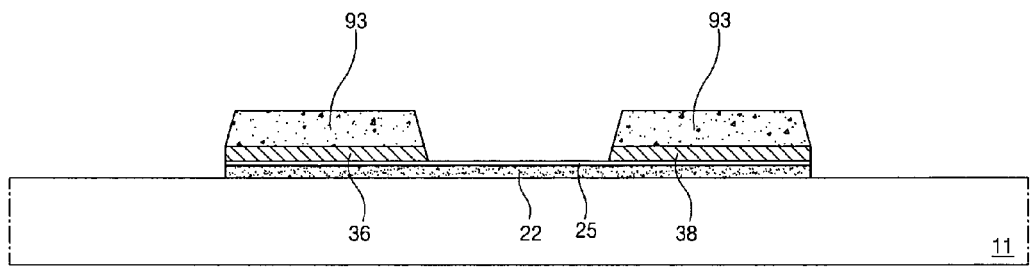
Figure 2E:
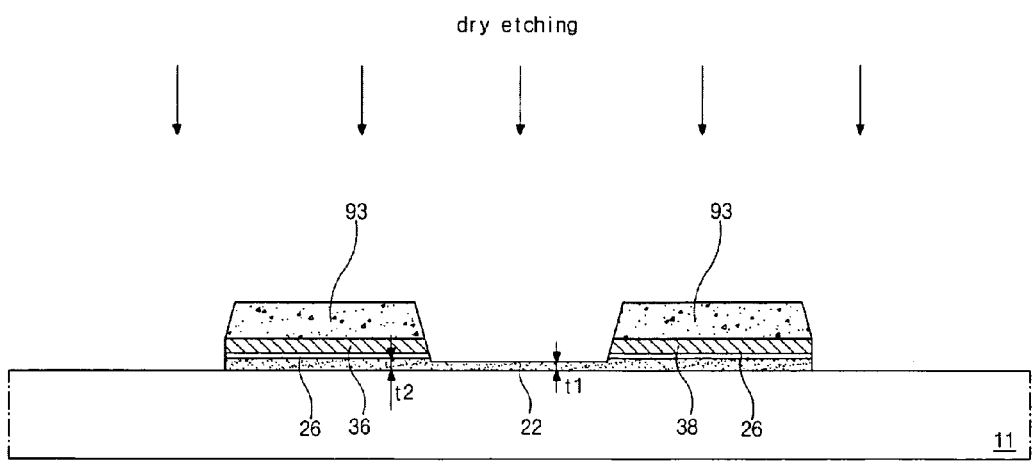
Figure 3A:
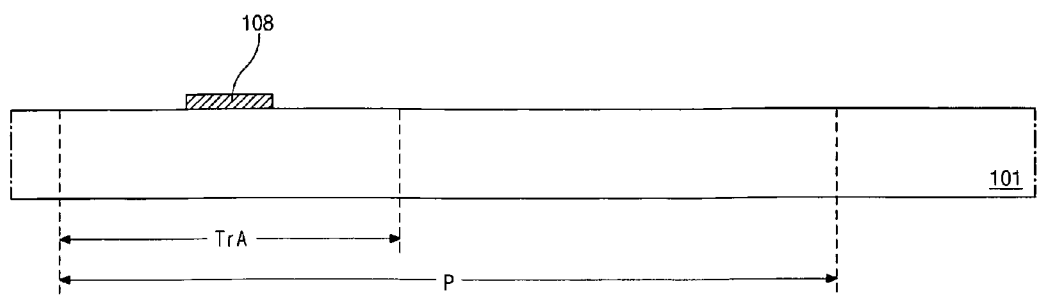
FIGS. 3A to 3K are cross-sectional views of illustrating an array substrate in processes of fabricating the same according to an embodiment of the present invention.

In FIG. 3A, a first metal layer (not shown) is formed on a transparent insulating substrate 101 by depositing one or more selected from a conductive metallic group and then patterned through a mask process, thereby forming a gate line (not shown) and a gate electrode 108. The gate line is formed along a first direction. The gate electrode 108 extends from the gate line and is disposed in the switching region TrA. The gate line and the gate electrode 108 may have a single-layered structure or a double-layered structure. The substrate 101 may be a glass substrate or a plastic substrate. The conductive metallic group may include copper (Cu), copper alloy, aluminum (Al), aluminum alloy such as aluminum neodymium (AlNd) and chromium (Cr). The mask process may include steps of applying photoresist, exposing the photoresist to light, developing the light-exposed photoresist and etching.

Figure 3B:
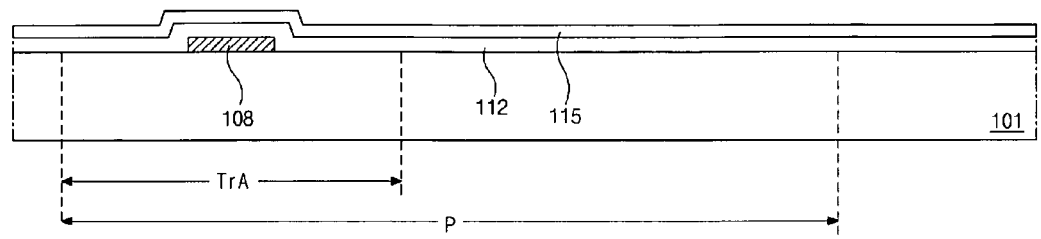

In FIG. 3B, a gate insulating layer 112 is formed on the gate line and the gate electrode 108 by depositing an inorganic insulating material, for example, silicon oxide ($SiO_2$) or silicon nitride ($SiN_x$) on a substantially entire surface of the substrate 101.

Next, an intrinsic amorphous silicon layer 115 is formed on the gate insulating layer 112 by depositing intrinsic amorphous silicon. The intrinsic amorphous silicon layer 115 may have a thickness of 300 Å to 700 Å. In the related art, the intrinsic amorphous silicon layer has a thickness of 1500 Å to 1800 Å considering partial removing of an active layer between source and drain electrodes. However, in the present invention, the active layer is not partially removed between the source and drain electrodes and does not have different thicknesses. Therefore, the intrinsic amorphous silicon layer 115 has the thickness of 300 Å to 700 Å such that the characteristics of the thin film transistor are maximized. Accordingly, the deposition time is decreased as compared to the related art, and manufacturing costs are lowered due to a decrease in an amount of the deposited intrinsic amorphous silicon. Here, the gate insulating layer 112 and the intrinsic amorphous silicon layer 115 may be sequentially formed in the same chamber of a chemical vapor deposition (CVD) apparatus.

Figure 3C:
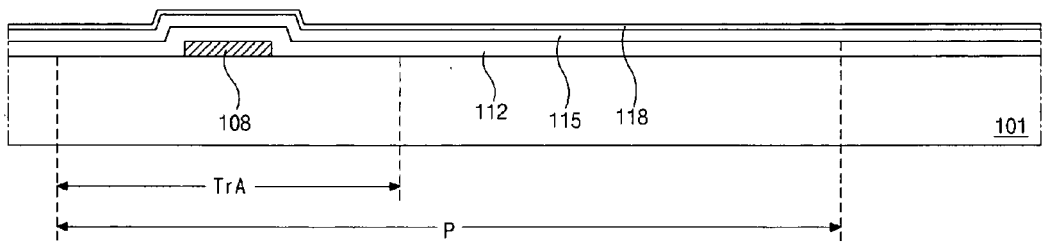

In FIG. 3C, an oxide semiconductor layer 118 is formed on the intrinsic amorphous silicon layer 115 by depositing an oxide semiconductor material, for example, amorphous-indium gallium zinc oxide (a-IGZO), indium zinc oxide (IZO) or zinc tin oxide (ZTO) by a sputtering method or by applying a liquid-type oxide semiconductor material by a coating method such as an inkjet coating method. The oxide semiconductor layer 118, beneficially, has a thickness of 50 Å to 500 Å.

Figure 3D:
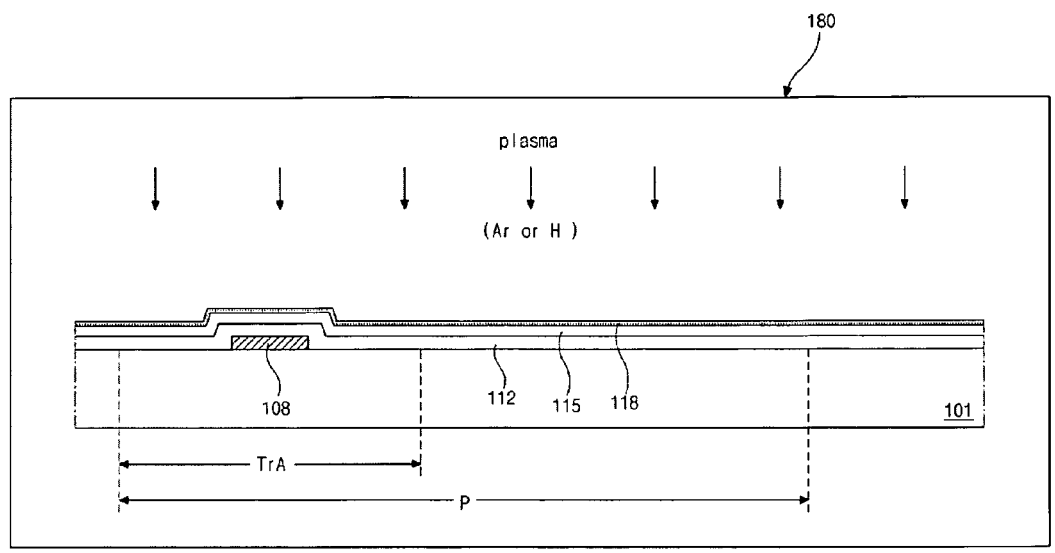

In FIG. 3D, a process for changing properties of the oxide semiconductor layer 118 is performed to the substrate 101 including the oxide semiconductor layer 118 thereon. Namely, the oxide semiconductor layer 118 having strong semiconductor properties may have strong conductive properties after the process. The conductive properties of the oxide semiconductor layer 118 are increased, and the oxide semiconductor layer 118 has an ohmic property. More particularly, the oxide semiconductor layer 118 may be plasma-treated in a vacuum chamber under argon (Ar) or hydrogen (H) gas atmosphere or may be heat-treated in an oven or furnace under 300 degrees of Celsius to 400 degrees of Celsius for several ten seconds to several ten minutes. The oxide semiconductor layer 118 becomes an ohmic contact layer between the intrinsic amorphous silicon layer 115 and a second metal layer, which is formed later for source and drain electrodes, due to the plasma treatment or the heat-treatment. If the plasma-treatment or the heat-treatment is not carried out, the oxide semiconductor layer 118 becomes a heterojunction layer, and a thin film transistor does not operate normally.

Figure 3E:
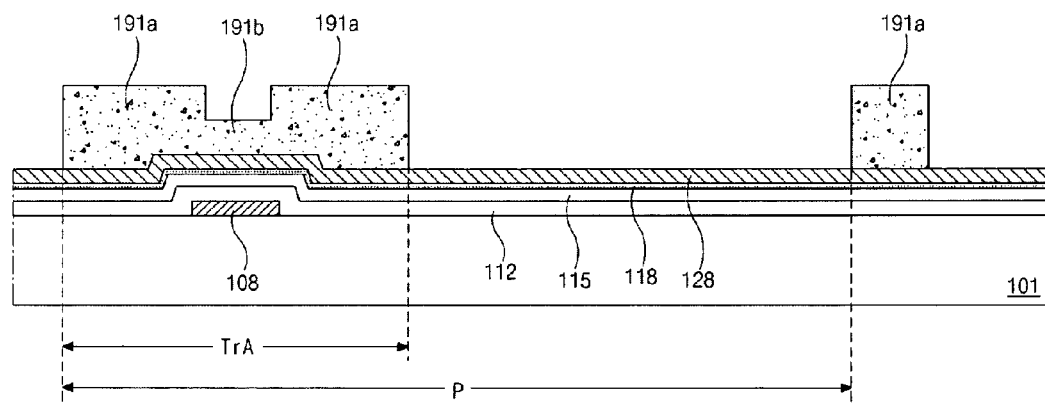

In FIG. 3E, a second metal layer 128 is formed on the oxide semiconductor layer 118 plasma-treated or heat-treated by depositing one selected from a metallic material group including aluminum (Al), aluminum alloy such as aluminum neodymium (AlNd), copper (Cu), copper alloy and chromium (Cr).

Then, a photoresist layer (not shown) is formed on the second metal layer 128 and exposed to light through a mask, which includes a light-transmitting portion, a light-blocking portion and a half light-transmitting portion. The half light-transmitting portion may include slits or a multiple-coating layer to control intensity of light passing therethrough and may have light transmittance larger than the light-blocking portion and smaller than the light-transmitting portion.

Next, the light-exposed photoresist layer (not shown) is developed, thereby forming a first photoresist pattern 191a and a second photoresist pattern 191b on the second metal layer. The first photoresist pattern 191a has a first thickness, and the second photoresist pattern 191b has a second thickness thinner than the first thickness. The first photoresist pattern 191a corresponds to areas where a data line, a source electrode and a drain electrode are formed, and the second photoresist pattern 191b corresponds to an area between the source and drain electrodes. The photoresist layer corresponding to other areas is removed to thereby expose the second metal layer 128.

Figure 3F:
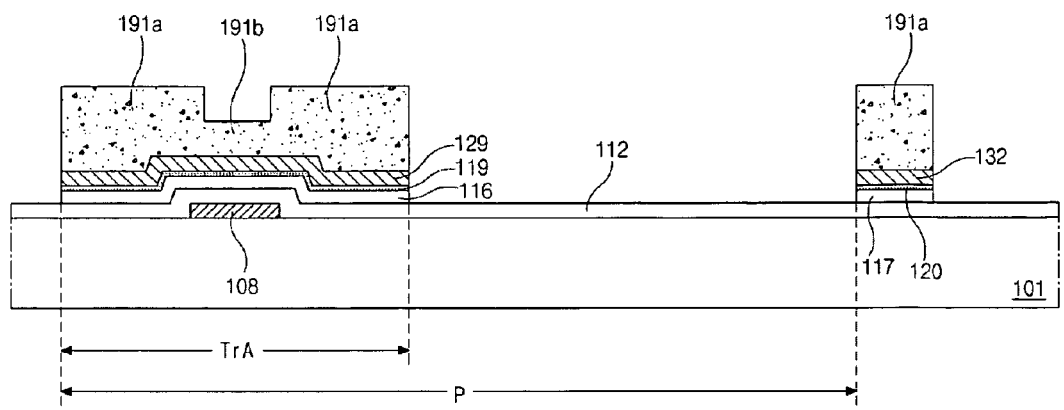

In FIG. 3F, the second metal layer 128 of FIG. 3E exposed by the first and second photoresist patterns 191a and 191b is wet-etched and removed by a first etchant, thereby forming a data line 132 and a source drain pattern 129 and exposing the oxide semiconductor layer 118 of FIG. 3E. The data line 132 is formed along a second direction and crosses the gate line (not shown) to define the pixel region P. The source drain pattern 129 is disposed in the switching region TrA and is connected to the data line 132.

Then, the exposed oxide semiconductor layer 118 of FIG. 3E is wet-etched and removed by a second etchant, thereby forming an oxide semiconductor pattern 119 under the source drain pattern 129 and exposing the intrinsic amorphous silicon layer 115 of FIG. 3E. The second etchant has different components from the first etchant. The second etchant does not react with a material of the second metal layer 128 of FIG. 3E and the intrinsic amorphous silicon and reacts with a material of the oxide semiconductor layer 118 of FIG. 3E.

Subsequently, the exposed intrinsic amorphous silicon layer 115 of FIG. 3E is dry-etched and removed, thereby forming an active layer 116 under the oxide semiconductor pattern 119. At this time, a first dummy pattern 120 and a second dummy pattern 117 is formed under the data line 132. The first dummy pattern 120 is formed of the same material as the oxide semiconductor pattern 119, and the second dummy pattern 117 is formed of the same material as the active layer 116.

Figure 3G:
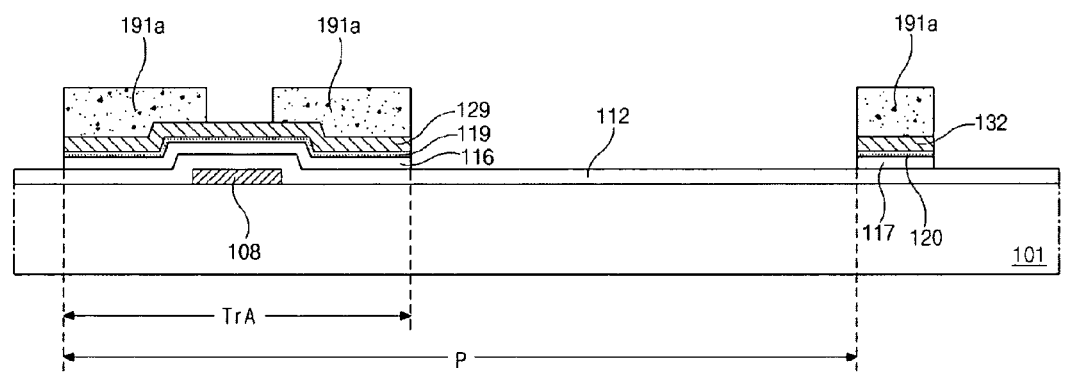

In FIG. 3G, an ashing process is performed to the substrate 101 including the source drain pattern 129 and the data line 132 thereon, and the second photoresist pattern 191b of FIG. 3F having the second thickness is removed, thereby exposing a central portion of the source drain pattern 129 in the switching region TrA. At this time, the first photoresist pattern 191a is also partially removed by the ashing process and has a reduced thickness.

Figure 3H:
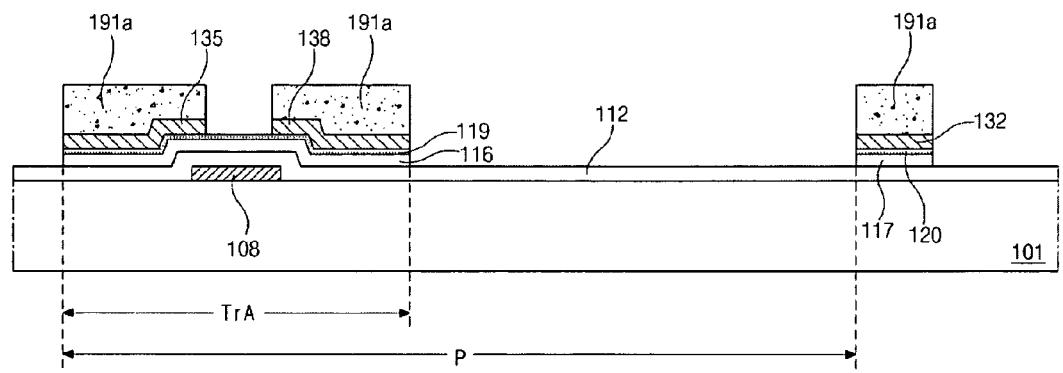

In FIG. 3H, the source drain pattern 129 of FIG. 3G exposed by the first photoresist pattern 191a is wet-etched and removed by the first etchant, thereby forming source and drain electrodes 135 and 138 and exposing the oxide semiconductor pattern 119 between the source and drain electrodes 135 and 138.

Figure 3I:
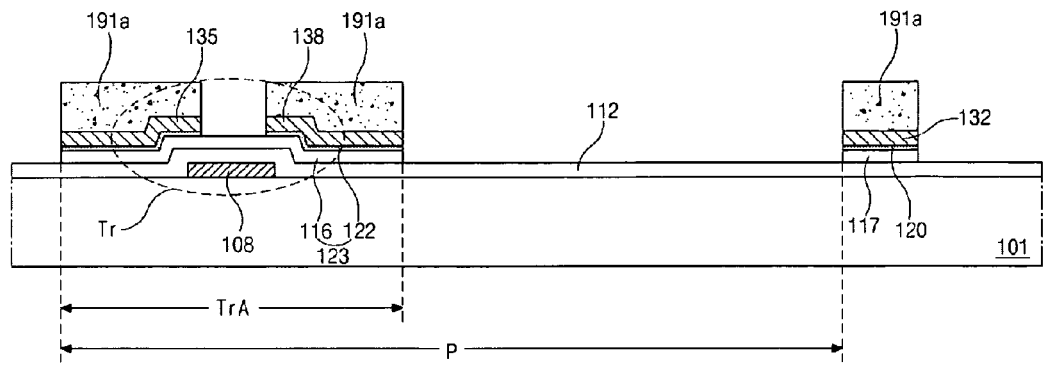

In FIG. 3I, the oxide semiconductor pattern 119 of FIG. 3H between the source and drain electrodes 135 and 138 is wet-etched and removed by the second etchant, thereby forming ohmic contact layers 122 under the source and drain electrodes 135 and 138 and exposing the active layer 116. The ohmic contact layers 122 are formed of the oxide semiconductor material and are spaced apart from each other. At this time, the active layer 116 is not affected by the second etchant, and there is no problem that a thickness of the active layer 116 is reduced between the source and drain electrodes 135 and 138 differently from the related art, where the ohmic contact layers are formed by dry-etching the impurity-doped amorphous silicon.

Accordingly, the active layer 116 does not have any damage on it surface and has a uniform thickness in the switching region TrA. The characteristics of a thin film transistor are not lowered. Here, the active layer 116 of the intrinsic amorphous silicon and the ohmic contact layers 122 of the oxide semiconductor material constitute a semiconductor layer 123.

The gate electrode 108, the gate insulating layer 112, the active layer 116, the ohmic contact layers 122, the source electrode 135 and the drain electrode 138 in the switching region TrA constitute a thin film transistor Tr.

In the meantime, although not shown in the figure, when the array substrate is used for an organic electroluminescent display device, a power line may be further formed on the same layer as, spaced apart from and parallel to the data line 132, and at least a thin film transistor, which may have the same structure as the thin film transistor Tr and function as a driving thin film transistor, may be formed in the pixel region P and connected to the thin film transistor Tr.

Figure 3J:
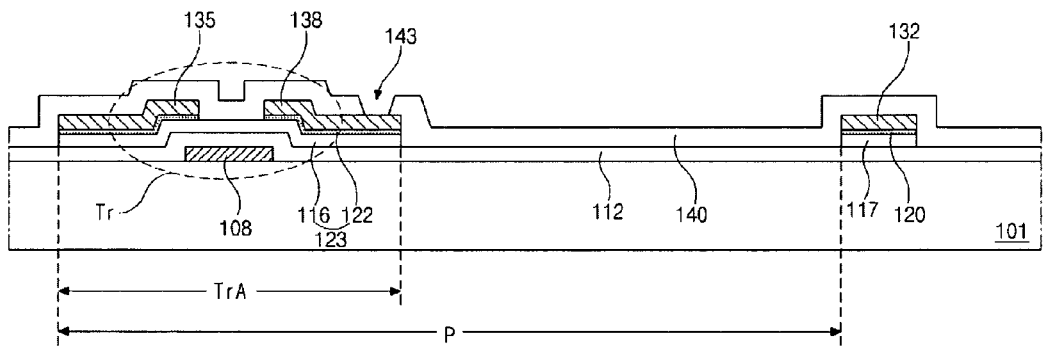

Next, in FIG. 3J, a stripping process is carried out to the substrate 101 including the source and drain electrodes 135 and 138 and the ohmic contact layers 122, thereby removing the first photoresist pattern 191a of FIG. 3I on the data line 132 and the source and drain electrodes 135 and 138 and exposing the data line 132 and the source and drain electrodes 135 and 138.

Then, a passivation layer 140 is formed on the source and drain electrodes 135 and 138 and the data line 132, which is exposed by removing the first photoresist pattern 191a of FIG. 3I, by depositing an inorganic insulating material, for example, silicon oxide (SiO2) or silicon nitride (SiNX), or applying an organic insulating material, for example, benzocyclobutene (BCB) or photo acryl. The passivation layer 140 is patterned through a mask process, thereby forming a drain contact hole 143 exposing a part of the drain electrode 138 in the pixel region P.

Figure 3K:
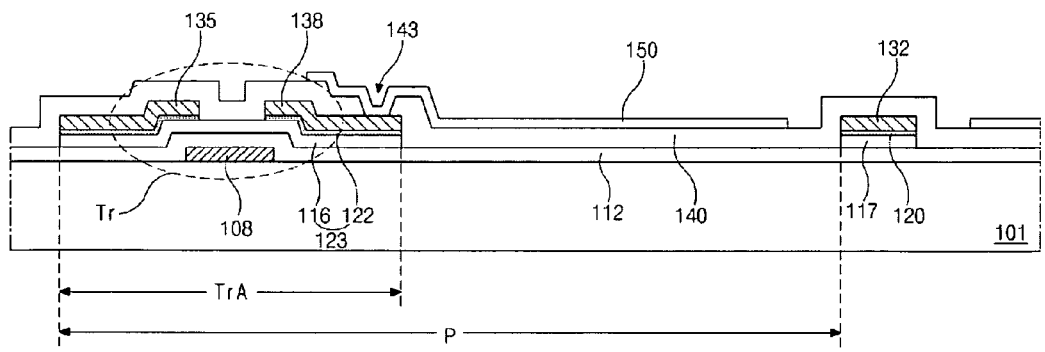

In FIG. 3K, a transparent conductive material layer (not shown) is formed on the passivation layer 140 having the drain contact hole 143 by depositing a transparent conductive material, for example, indium tin oxide (ITO) or indium zinc oxide (IZO) on a substantially entire surface of the substrate 101. The transparent conductive material layer is patterned through a mask process, thereby forming a pixel electrode 150 in the pixel region P. The pixel electrode 150 contacts the drain electrode 138 through the drain contact hole 143. Accordingly, the array substrate according to the embodiment of the present invention is completed.

Meanwhile, in an organic electroluminescent display device including switching and driving thin film transistors in the pixel region P, the thin film transistor Tr in the switching region TrA functions as a switching thin film transistor, and the drain electrode 138 of the thin film transistor Tr does not contact the pixel electrode 150. Instead, the thin film transistor Tr in the switching region TrA is entirely covered with the passivation layer 150 without the drain contact holes 143, and a drain electrode (not shown) of the driving thin film transistor (not shown) contacts and is electrically connected to the pixel electrode 150 through a drain contact hole (not shown) exposing the drain electrode of the driving thin film transistor. The driving thin film transistor is electrically connected to the thin film transistor Tr in the switching region TrA. Accordingly, the substrate 101 including the thin film transistor Tr, which is disposed in the switching region TrA and is connected to the gate line (not shown) and the data line 132, and the driving thin film transistor, which is connected to the transistor TrA and the pixel electrode 150, is used as an array substrate for an organic electroluminescent display device.

The above-mentioned array substrate is manufactured by 4 mask processes. In another embodiment, an array substrate can be manufactured by 5 mask processes.

A fabricating method according to another embodiment of the present invention will be explained hereinafter with reference to accompanying drawings. In a fabricating method according to 5 mask processes, steps of forming a semiconductor layer and source and drain electrodes are different from those of a fabricating method according to 4 mask processes. The steps of forming a semiconductor layer and source and drain electrodes will be mainly described.

FIGS. 4A to 4E are cross-sectional views of illustrating an array substrate in processes of fabricating the same according to another embodiment of the present invention. FIGS. 4A to 4E show a pixel region including a thin film transistor.

Figure 4A:
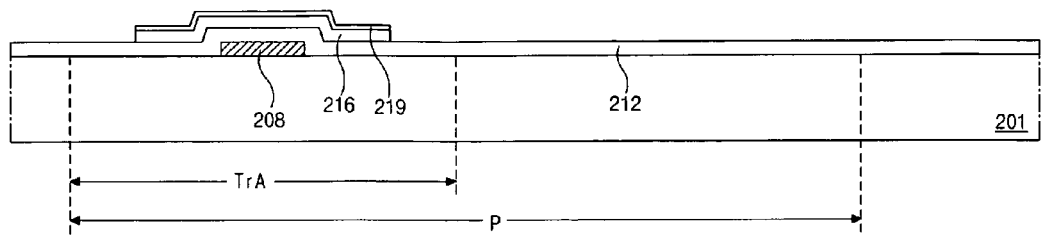
FIGS. 4A to 4E are cross-sectional views of illustrating an array substrate in processes of fabricating the same according to another embodiment of the present invention.

In FIG. 4A, a gate line (not shown) and a gate electrode 208 are formed on a substrate 201 as stated in the previous embodiment. A gate insulating layer 212 is formed on the gate line and the gate electrode 208.

Next, an intrinsic amorphous silicon layer (not shown) is formed on the gate insulating layer 212 by depositing intrinsic amorphous silicon. Subsequently, an oxide semiconductor layer (not shown) is formed on the intrinsic amorphous silicon layer by depositing or applying one of oxide semiconductor materials mentioned above.

The oxide semiconductor layer and the intrinsic amorphous silicon layer are patterned through a mask process, thereby forming an active layer 215 of the intrinsic amorphous silicon and an oxide semiconductor pattern 210 corresponding to the gate electrode 208. The mask process may include wet-etching.

Figure 4B:
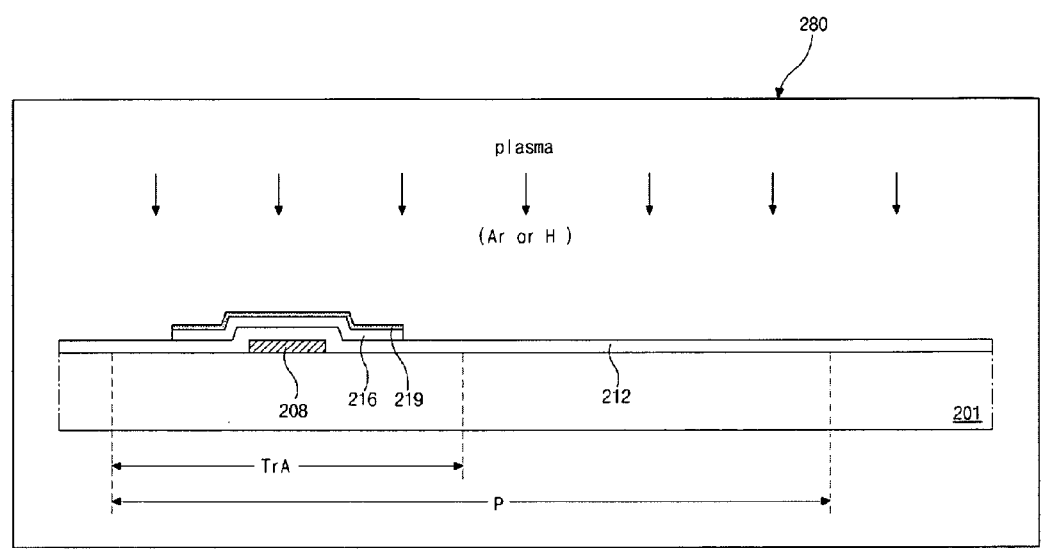

In FIG. 4B, the substrate 201 including the oxide semiconductor pattern 219 thereon is plasma-treated in a vacuum chamber under argon (Ar) or hydrogen (H) gas atmosphere or heat-treated in an oven or furnace under 300 degrees of Celsius to 400 degrees of Celsius for several ten seconds to several ten minutes, so that the oxide semiconductor pattern 219 may have strong conductive properties from strong semiconductor properties.

Figure 4C:
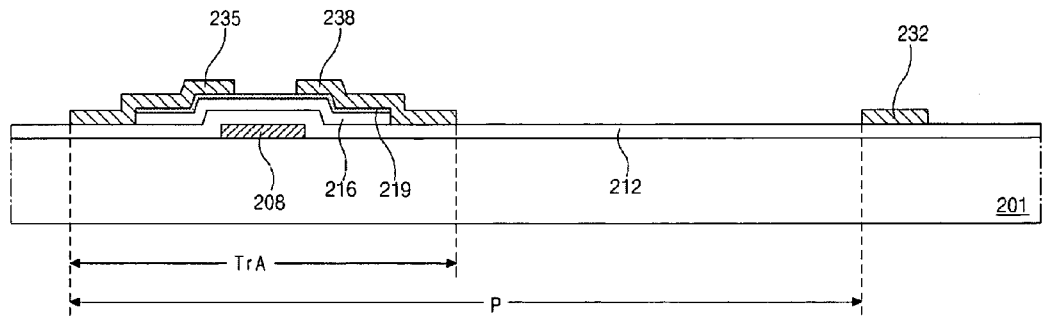

In FIG. 4C, a second metal layer (not shown) is formed on the oxide semiconductor pattern 219 plasma-treated or heat-treated by depositing one of aluminum (Al), aluminum alloy such as aluminum neodymium (AlNd), copper (Cu), copper alloy and chromium (Cr) as stated above.

The second metal layer is patterned through a mask process including wet-etching using a first etchant, thereby forming a data line 232 and source and drain electrodes 235 and 238 and exposing the oxide semiconductor pattern 219. The data line 323 crosses the gate line to define the pixel region P. The source and drain electrodes 235 and 238 are disposed in the switching region TrA and spaced apart from each other over the oxide semiconductor pattern 219.

Figure 4D:
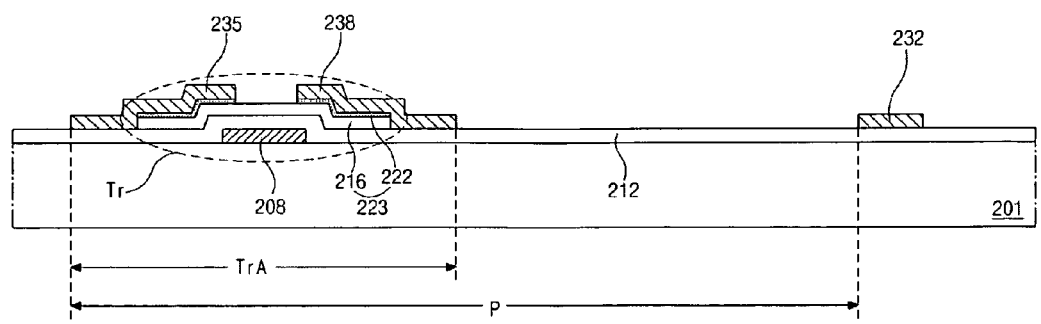

In FIG. 4D, the oxide semiconductor pattern 219 between the source and drain electrodes 235 and 238 is wet-etched and removed by a second etchant, thereby forming ohmic contact layers 222 that are spaced apart from each other under the source and drain electrodes 235 and 238, respectively. The active layer 216 is not affected by the second etchant and thus has a uniform thickness in the switching region TrA.

In this embodiment, since the active layer 216 and the source and drain electrodes 235 and 238 are patterned through different mask processes, first and second dummy patterns are not formed under the data line 232.

Figure 4E:
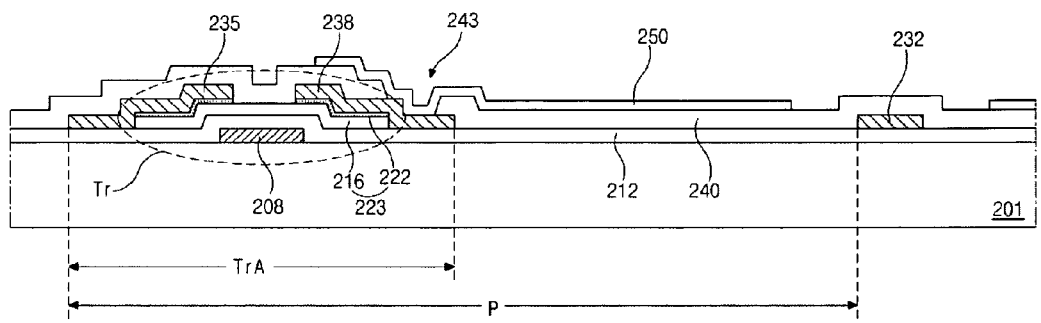

In FIG. 4E, a passivation layer 240 is formed on the source and drain electrodes 235 and 238 and the data line 232 by depositing an inorganic insulating material or applying an organic insulating material. The passivation layer 240 is patterned through a mask process, thereby forming a drain contact hole 243 exposing a part of the drain electrode 238.

Next, a transparent conductive material layer (not shown) is formed on the passivation layer 240 having the drain contact hole 243 by depositing a transparent conductive material on a substantially entire surface of the substrate 201. The transparent conductive material layer is patterned through a mask process, thereby forming a pixel electrode 250 in the pixel region P. The pixel electrode 250 contacts the drain electrode 238 through the drain contact hole 243. Accordingly, the array substrate according to another embodiment of the present invention is completed.

In the present invention, since the ohmic contact layers are formed by wet-etching, the active layer is not affected by dry-etching, and the surface of the active layer is not damaged. The properties of the thin film transistor are prevented from being lowered.

Moreover, the intrinsic amorphous silicon for the active layer can have a reduced thickness as compared with the related art. The deposition time is decreased, and the productivity is increased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a display device, comprising:

forming a gate line and a gate electrode on a substrate, where a pixel region including switching region is defined;

forming a gate insulating layer and an intrinsic amorphous silicon layer on the gate line and a gate electrode;

forming an oxide semiconductor layer on the intrinsic amorphous silicon layer;

increasing a conductive property of the oxide semiconductor layer such that the oxide semiconductor layer has an ohmic property;

forming a metal layer on the oxide semiconductor layer having the ohmic property;

forming first and second photoresist patterns on the metal layer, the first photoresist pattern having a first thickness, the second photoresist pattern having a second thickness thinner than the first thickness;

forming a data line, a source drain pattern, an oxide semiconductor pattern and an active layer by patterning the metal layer, the oxide semiconductor layer and the intrinsic amorphous silicon layer using the first and second photoresist patterns as an etching mask, wherein the active layer is disposed over the gate electrode in the switching region, the oxide semiconductor pattern is disposed on the active layer, the data line crosses the gate line to define the pixel region, and the source drain pattern is connected to the data line and disposed on the oxide semiconductor pattern;

removing the second photoresist pattern and exposing the source drain pattern;

wet-etching the source drain pattern exposed by removing the second photoresist pattern using a first etchant, thereby forming source and drain electrodes and exposing the oxide semiconductor pattern;

wet-etching the oxide semiconductor pattern exposed by wet-etching the source and drain pattern using a second etchant, thereby forming ohmic contact layers and exposing the active layer;

removing the first photoresist pattern and exposing the source and drain electrodes;

forming a passivation layer on the source and drain electrodes exposed by removing the first photoresist pattern and the active layer exposed by wet-etching the oxide semiconductor pattern, the passivation layer having a drain contact hole exposing the drain electrode; and forming a pixel electrode on the passivation layer in the pixel region, the pixel electrode connected to the drain electrode through the drain contact hole, wherein the active layer has a uniform thickness in the switching region.

2. The method according to claim 1, wherein increasing a conductive property of the oxide semiconductor layer includes one of plasma-treating the substrate including the oxide semiconductor layer thereon in a chamber under argon (Ar) or hydrogen (H) gas atmosphere and heat-treating the substrate including the oxide semiconductor layer thereon in an oven or furnace under 300 degrees of Celsius to 400 degrees of Celsius for several ten seconds to several ten minutes.

3. The method according to claim 1, wherein the intrinsic amorphous silicon layer has a thickness of 300 Å to 700 Å.

4. The method according to claim 1, wherein the oxide semiconductor layer has a thickness of 50 Å to 500 Å.

5. The method according to claim 1, wherein the oxide semiconductor layer includes one of amorphous-indium gallium zinc oxide, indium zinc oxide and zinc tin oxide.

6. The method according to claim 1, wherein the second etchant does not react with the intrinsic amorphous silicon.

7. The method according to claim 1, wherein forming a data line, a source drain pattern, an oxide semiconductor pattern and an active layer
   wet-etching the metal layer using the first etchant;
   wet-etching the oxide semiconductor layer using the second etchant; and
   dry-etching the intrinsic amorphous silicon layer.

8. A method of fabricating an array substrate for a display device, comprising:
   forming a gate line and a gate electrode on a substrate, where a pixel region including switching region is defined;
   forming a gate insulating layer and an intrinsic amorphous silicon layer on the gate line and a gate electrode;
   forming an oxide semiconductor layer on the intrinsic amorphous silicon layer;
   forming an oxide semiconductor pattern and an active layer in the switching region by patterning the oxide semiconductor layer and the intrinsic amorphous silicon layer;
   increasing a conductive property of the oxide semiconductor pattern such that the oxide semiconductor pattern has an ohmic property;
   forming a metal layer on the oxide semiconductor pattern having the ohmic property;
   wet-etching the metal layer using a first etchant, thereby forming a data line, a source electrode and a drain electrode and exposing the oxide semiconductor pattern, wherein the data line crosses the gate line to define the pixel region, the source electrode is connected to the data line, and the drain electrode is space apart from the source electrode on the oxide semiconductor pattern;
   wet-etching the oxide semiconductor pattern exposed by wet-etching the metal layer using a second etchant, thereby forming ohmic contact layers and exposing the active layer;
   forming a passivation layer on the source and drain electrodes and the active layer exposed by wet-etching the oxide semiconductor pattern, the passivation layer having a drain contact hole exposing the drain electrode; and
   forming a pixel electrode on the passivation layer in the pixel region, the pixel electrode connected to the drain electrode through the drain contact hole,
   wherein the active layer has a uniform thickness in the switching region.

9. The method according to claim 8, wherein increasing a conductive property of the oxide semiconductor pattern includes one of plasma-treating the substrate including the oxide semiconductor pattern thereon in a chamber under argon (Ar) or hydrogen (H) gas atmosphere and heat-treating the substrate including the oxide semiconductor pattern thereon in an oven or furnace under 300 degrees of Celsius to 400 degrees of Celsius for several ten seconds to several ten minutes.

10. The method according to claim 8, wherein the intrinsic amorphous silicon layer has a thickness of 300 Å to 700 Å.

11. The method according to claim 8, wherein the oxide semiconductor layer has a thickness of 50 Å to 500 Å.

12. The method according to claim 8, wherein the oxide semiconductor layer includes one of amorphous-indium gallium zinc oxide, indium zinc oxide and zinc tin oxide.

13. The method according to claim 8, wherein the second etchant does not react with the intrinsic amorphous silicon.

* * * * *